(12) United States Patent
Chan et al.

(10) Patent No.: US 8,674,394 B2
(45) Date of Patent: Mar. 18, 2014

(54) LIGHT EMITTING DEVICE PACKAGE AND METHOD OF MANUFACTURING THE SAME

(75) Inventors: Shiun-Wei Chan, Hukou (TW); Chih-Hsun Ke, Hukou (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 303 days.

(21) Appl. No.: 13/172,731

(22) Filed: Jun. 29, 2011

(65) Prior Publication Data

US 2012/0074452 A1 Mar. 29, 2012

(30) Foreign Application Priority Data

Sep. 27, 2010 (CN) .......................... 2010 1 0287003

(51) Int. Cl.
*H01L 33/48* (2010.01)

(52) U.S. Cl.
USPC .......... 257/99; 257/96; 257/98; 257/E33.056; 257/E33.061; 257/E33.067

(58) Field of Classification Search
None
See application file for complete search history.

(56) References Cited

U.S. PATENT DOCUMENTS

| | | | |
|---|---|---|---|
| 2004/0169466 A1* | 9/2004 | Suehiro et al. | 313/512 |
| 2005/0239227 A1* | 10/2005 | Aanegola et al. | 438/26 |
| 2006/0097245 A1* | 5/2006 | Aanegola et al. | 257/26 |
| 2006/0186423 A1* | 8/2006 | Blonder et al. | 257/98 |
| 2008/0029774 A1* | 2/2008 | Shishov et al. | 257/96 |
| 2009/0162957 A1* | 6/2009 | Joung | 438/27 |
| 2010/0055813 A1* | 3/2010 | Sun et al. | 438/27 |
| 2011/0001422 A1* | 1/2011 | Aanegola et al. | 313/501 |
| 2011/0278610 A1* | 11/2011 | Jeong et al. | 257/98 |
| 2012/0244652 A1* | 9/2012 | Chen et al. | 438/27 |

* cited by examiner

*Primary Examiner* — Minh-Loan T Tran
*Assistant Examiner* — Fazli Erdem
(74) *Attorney, Agent, or Firm* — Novak Druce Connolly Bove + Quigg LLP

(57) ABSTRACT

A light emitting device package includes a base, a light emitting element, a mask, metal wires, an encapsulating layer and a cover layer. The base has a first surface bearing electrical structure thereon and an opposite second surface. The mask is arranged on the first surface to define a space receiving the light emitting element. Two openings are defined in the mask. The light emitting element has two pads exposed to an outside through the two openings respectively. The metal wires electrically connect the pads and the electrical structures. The encapsulating layer is filled in the space and two through holes in the base and encapsulates the light emitting element. The encapsulating layer is separated from the metal wires. The cover layer covers and protects the mask and the metal wires. A method of manufacturing the package is also provided.

15 Claims, 13 Drawing Sheets

LIGHT EMITTING DEVICE PACKAGE AND METHOD OF MANUFACTURING THE SAME

BACKGROUND

1. Technical Field

The present disclosure relates generally to light emitting devices, and more particularly to a package of light emitting device and a method of manufacturing the package.

2. Description of Related Art

Light emitting diodes (LEDs) are solid state light emitting devices formed of semiconductors, which are more stable and reliable than other conventional light sources such as incandescent bulbs. Thus, LEDs are being widely used in various fields such as numeral/character displaying elements, signal lights, light sources for lighting and display devices. When in use, providing LEDs in packages can provide protection, color selection, focusing and the like for light emitted by the LEDs.

A typical LED package includes a base, an LED chip, and an encapsulating layer. The LED chip is electrically connected to electrical structures on the base via gold wires. The encapsulating layer encapsulates the LED chip. Generally, in the process of encapsulating, the encapsulating layer covers the LED chip by a technique of molding. However, the LED chip and gold wires are prone to damage during the process of molding. Thus, a reliability of the LED chip and electrical connection between the LED chip and the gold wires is impaired. The LED package has a risk of failing to work due to the damage to the LED chip or the electrical connection between the LED chip and the gold wires.

What is needed therefore is a light emitting device package and a method of packaging a light emitting device which can overcome the above mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 10:
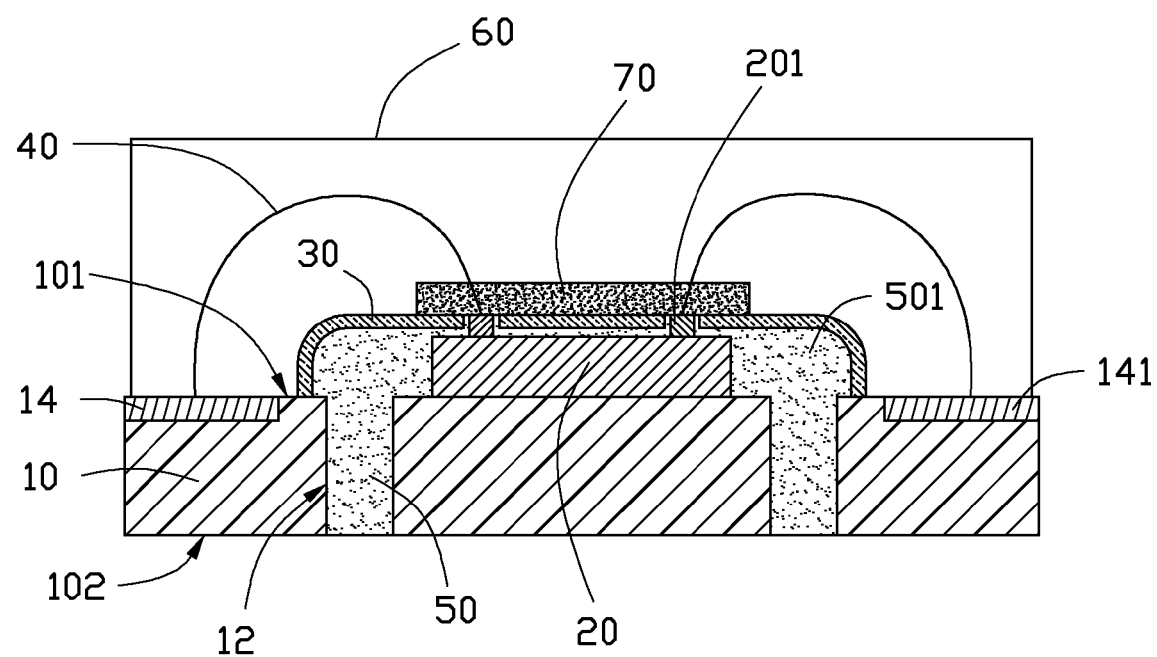

Referring to FIG. 10, a light emitting device package in accordance with an embodiment of the present disclosure is illustrated. The light emitting device package comprises a base 10, a light emitting element 20 mounted on the base 10, a mask 30 covering the light emitting element 20, metal wires 40 electrically connecting to the light emitting element 20 and the base 10, an encapsulating layer 50 encapsulating the light emitting element 20, and a cover layer 60 covering the mask 30 and the metal wires 40 to protect them from damage or injury.

The base 10 has a first surface 101 and a second surface 102 opposite to the first surface 101. Two or more through holes 12 are defined in the base 10 and extend through the first and second surfaces 101, 102. The through holes 12 function as passages to receive the encapsulating layer 50. The number of the through holes 12 can be altered according to an actual requirement. The shape of each of the through holes 12 in a top view can be round, rectangular, etc. The through holes 12 can be positioned around the light emitting element 20 in a matrix, or in a circle. Electrical structures 14 are formed on the first surface 101 around the through holes 12. The electrical structures 14 comprise at least two terminals 141.

The light emitting element 20 is mounted on the first surface 101 of the base 10, and surrounded by the through holes 12. The light emitting element 20 can be a light emitting diode (LED), a laser diode and/or other semiconductor lighting devices which include one or more semiconductor layers, which may include silicon, silicon carbide, gallium nitride and/or other semiconductor materials. In the present embodiment, the light emitting element 20 is an LED. It is understood that, an ultraviolet, blue and/or green LED may be provided. The light emitting element 20 has two pads 201 with reverse polarities. In some embodiments, the pads 201 can form additional shoulders thereon to increase a height of the pads 201 for conveniently connecting to the metal wires 40. The pads 201 are positioned at a top surface of the light emitting element 20, that is, the light emitting element 20 is a horizontal structure LED. It is noted that the light emitting element 20 can be a vertical structure LED with the two pads 201 positioned on top and bottom surfaces thereof in an alternative embodiment.

Figure 3:
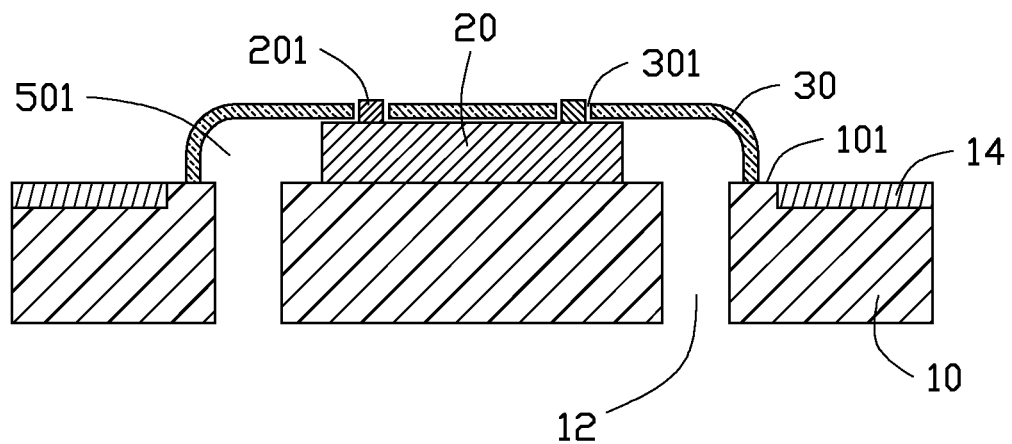

Also referring to FIG. 3, the mask 30 is arranged on the first surface 101 of the base 10 and covers the light emitting element 20. A space 501 is defined between the mask 30 and the first surface 101. The space 501 is used for receiving the encapsulating layer 50. The mask 30 is made of transparent or translucent material so that light generated by the light emitting element 20 can transmit through the mask 30. The mask 30 defines two openings 301 therein. The openings 301 correspond to the pads 201 of the light emitting element 20 respectively for exposing the pads 201 outside of the mask 30. It is understood that number of the openings 301 is identical to that of the pads 201 at the top surface of the light emitting element 20, and if the light emitting element 20 is a vertical structure LED, the mask 30 defines a single opening 301 corresponding to the pad 201 at the top surface of the light emitting element 20. The openings 301 can be designed to have such an exact size that only permits the extension of the pads 201 therethrough. Thus, when forming the encapsulating layer 50, the liquid encapsulating material can be prevented from leaking out of the mask 30 via the openings 301 to the largest extent.

The metal wires 40 electrically connect the pads 201 of the light emitting element 20 and the electrical structures 14. The metal wires 40 are positioned outside of the mask 30. Each metal wire 40 connects one of the pads 201 with one end thereof, and one of the terminals 141 with an opposite end thereof. The number of the metal wires 40 can be two or more in this embodiment. It is noted that if the light emitting element 20 is a vertical structure LED, the number of the metal wires 40 can be one which connects to the pad 201 at the top surface of the light emitting element 20, and the pad 201 at the bottom surface of the light emitting element 20 can connect a corresponding electrical structure 14 directly.

Figure 6:
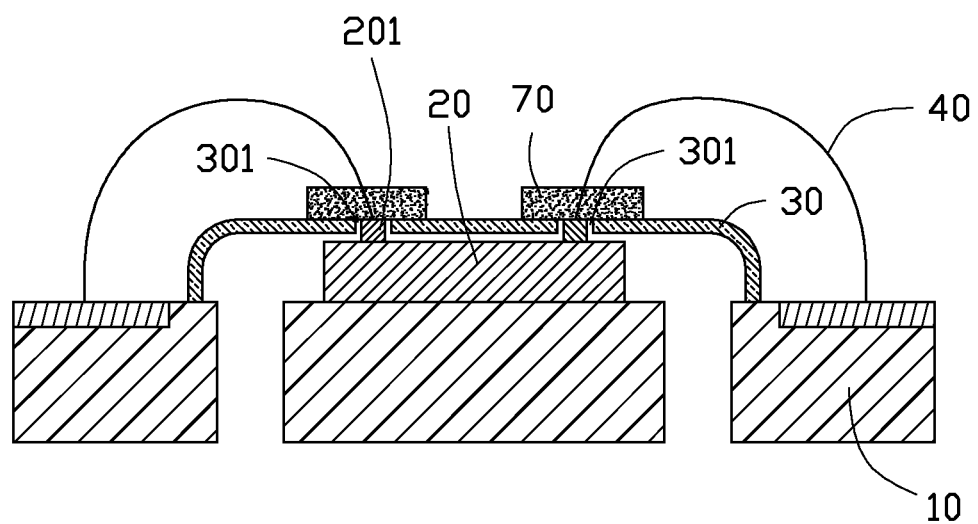

In some embodiments, a sealing layer 70 can be optionally formed on the mask 30 to seal the joints of the pads 201 and the metal wires 40. The sealing layer 70 can increase a joining strength of the metal wires 40 and the pads 201. The sealing layer 70 positioned at the openings 301 can also function as a leak proof structure to prevent the liquid encapsulating material from leaking from the openings 301 when forming the encapsulating layer 50. As shown in FIG. 6, the sealing layer 70 can be divided into multiple ones separated from each other. Each sealing layer 70 seals a corresponding opening 301. The sealing layer 70 can be silicone, epoxy or the mixture of the two. The sealing layer 70 can also contain phosphors therein.

The encapsulating layer 50 is filled in the space 501 between the first surface 101 of the base 10 and the mask 30, and encapsulates the light emitting element 20. The encapsulating layer 50 also seals the through holes 12 of the base 12. The encapsulating layer 50 contains phosphors therein. The phosphors may be YAG phosphors, silicon oxynitride phosphors, or nitride phosphors, etc. The phosphors in the encapsulating layer 50 can be excited by the light from the light emitting element 20 to emit light with a wave length different from that of the light generated by the light emitting element 20. The two lights with different wave lengths combining together can obtain a light with a desired color such as white.

The cover layer 60 is arranged on the first surface 101 of the base 10 and shields the mask 30 and the metal wires 40. The cover layer 60 is made of transparent or translucent material through which light is able to penetrate. The cover layer 60 may comprise inorganic material such as silica ($SiO_2$) or titanium dioxide ($TiO_2$).

The light emitting device package provided by the present disclosure is characterized in that the encapsulating layer 50 is not in contact with the metal wires 40. Thus, the damage to the joints of the metal wires 40 and the light emitting element 20 during the encapsulating process in the conventional light emitting device package is eliminated in the light emitting device package provided by the present disclosure. In addition, the mask 30 can be designed to have such a height that the encapsulating layer 50 only covers lateral sides of the light emitting element 20, whereby a damage to the light emitting element 20 during the encapsulating process can be at least partly decreased.

Figure 11:
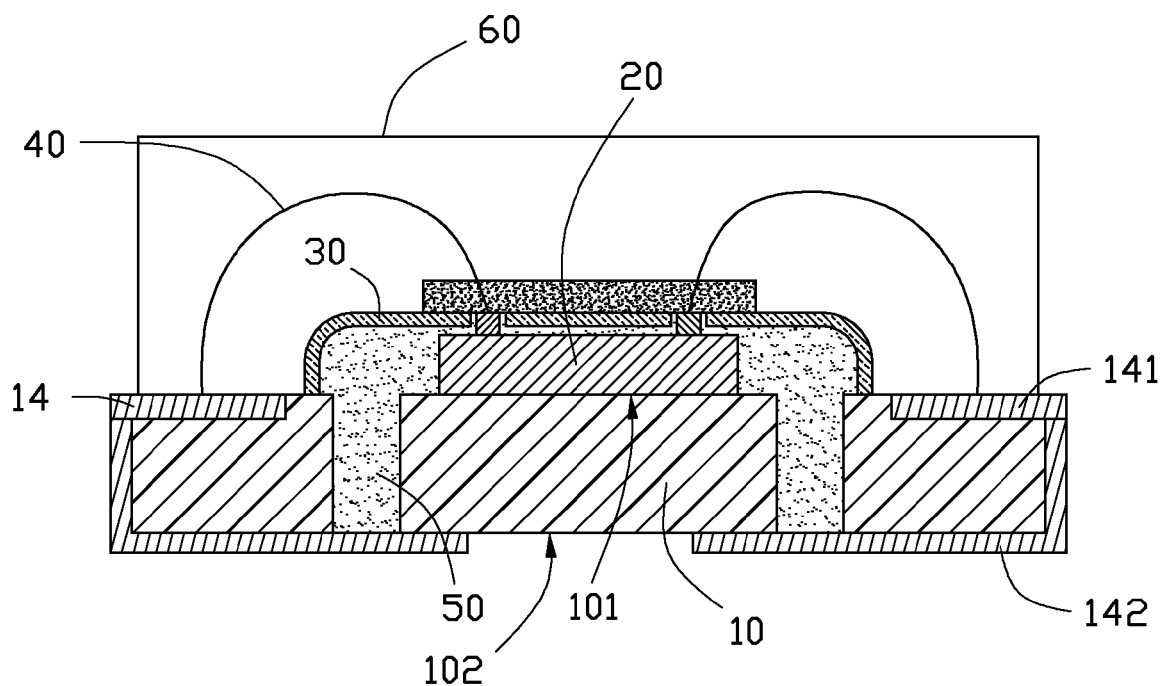
FIGS. 11-13 are cross sectional views of light emitting device packages in accordance with different embodiments of the present disclosure.

Referring to FIG. 11, a light emitting device package in accordance with an alternative embodiment can further comprise extended layers 142 extending from the electrical structures 14. The extended layers 142 each connect one of the terminals 141 and extend from the first surface 101 to the second surface 102 of the base 10. The extended layers 142 are configured to facilitate subsequent usage or installation of the light emitting device package.

Figure 12:
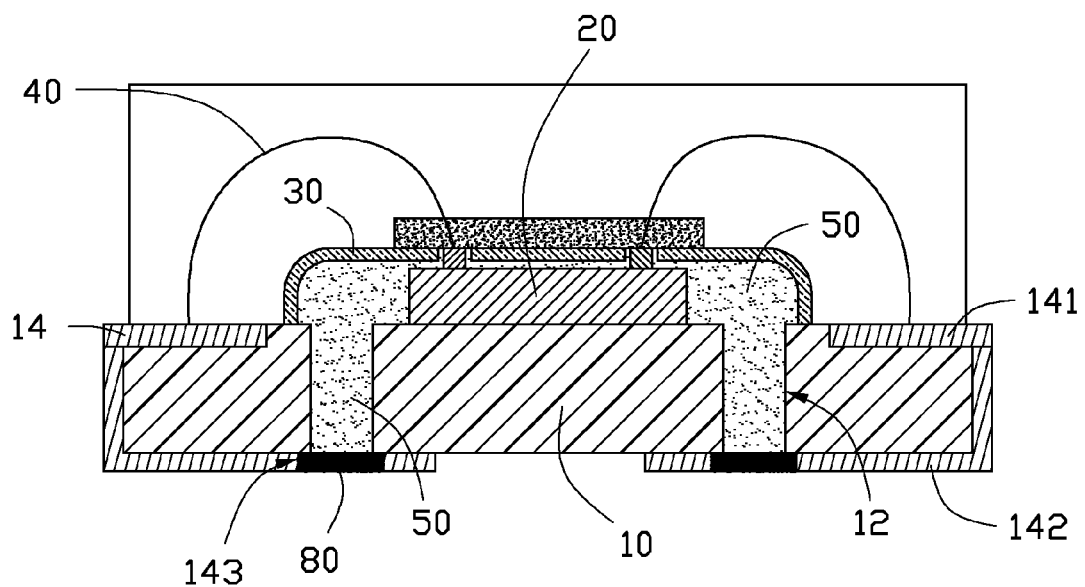

Referring to FIG. 12, multiple holes 143 can be defined in the extended layer 142 corresponding to the through holes 12 of the base 10 respectively. After forming the encapsulating layer 50, the holes 143 are sealed by soldering material 80.

Figure 13:
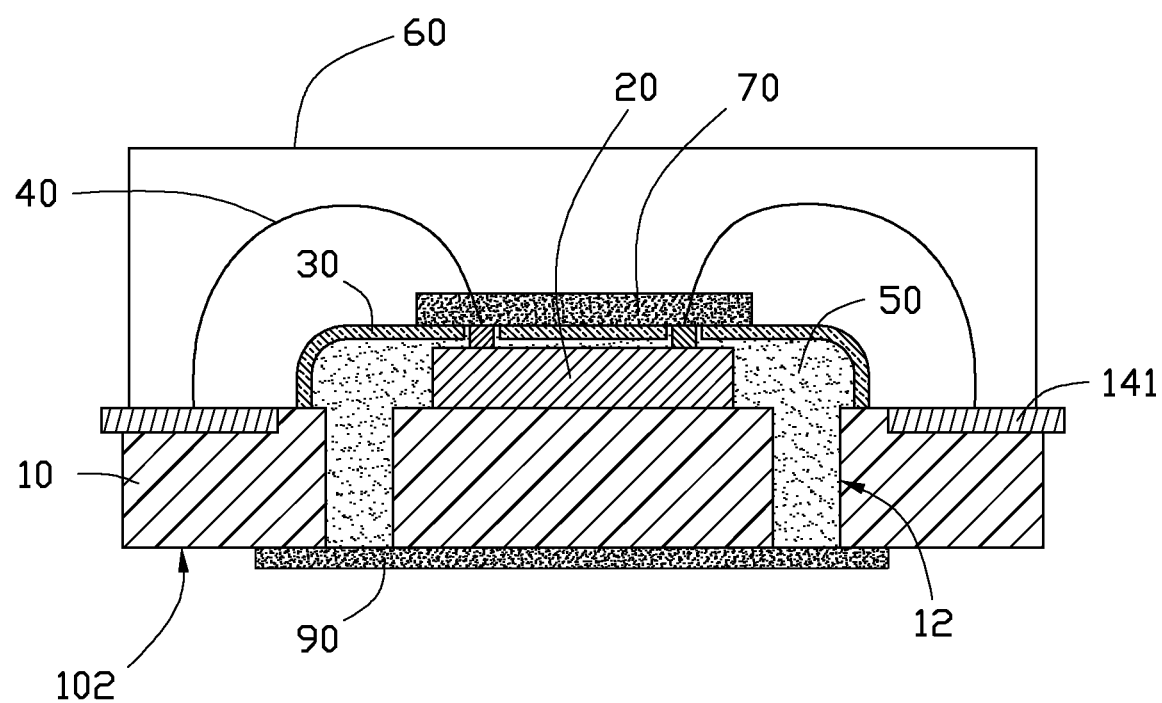

Referring to FIG. 13, a light emitting device package in accordance with an alternative embodiment, in comparison with the embodiment of FIG. 10, can further comprise another sealing layer 90 formed on the second surface 102 of the base 10. The another sealing layer 90 seals the through holes 12 of the base 10 to protect the encapsulating layer 50.

Figure 9:
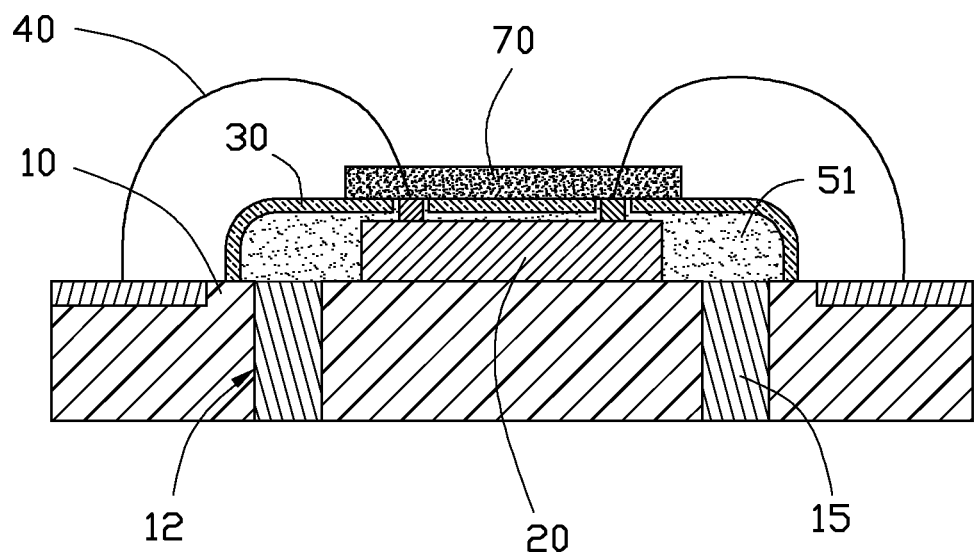

Referring to FIG. 9, a light emitting device package in accordance with an alternative embodiment, in comparison with the embodiment of FIG. 10, is different in that the encapsulating material 50 in the through holes 12 of FIG. 10 is replaced by heat conductive material 15 of FIG. 9. The heat conductive material 15 can be metal, ceramics or other material having a good heat conductivity. The heat conductive material 15 not only increase a heat dissipating efficiency of the base 10 but also protect the encapsulating layer 50 from contamination. The encapsulating material 50 in this embodiment is only filled in the space 501.

It is understood that features described in the above different embodiments can be combined or altered without departing from the spirit of the disclosure. For example, the heat conductive material 15 can be covered by the extended layer 142 or the another sealing layer 90.

A method of manufacturing a light emitting device package provided by the present disclosure now will be described in detail hereinafter with reference to FIGS. 1-10.

Figure 1:
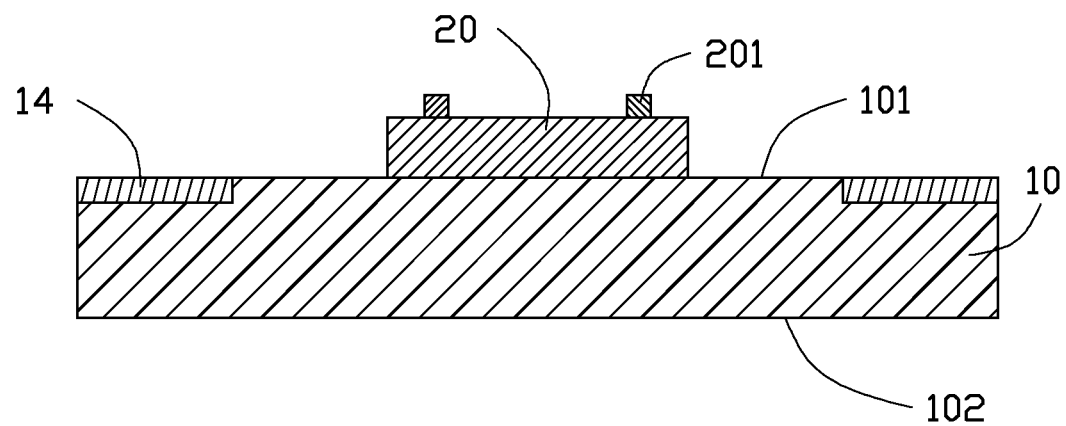
FIGS. 1-10 are cross sectional views showing different steps of a method for forming a light emitting device package obtained by packaging a light emitting device in accordance with an embodiment of the present disclosure.
Figure 2:
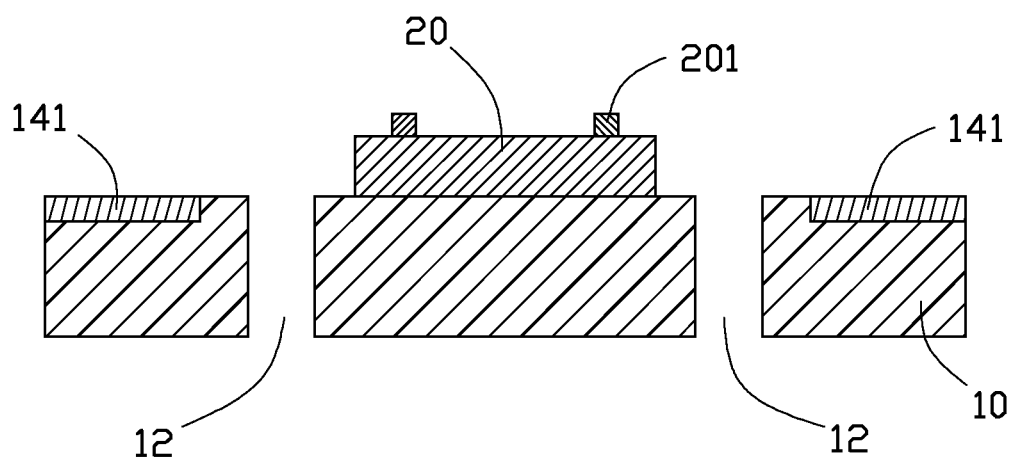

Referring to FIGS. 1 and 2, a base 10 is provided. The base 10 has a first surface 101 and a second surface 102 opposite to the first surface 101. The base 10 has at least two through holes 12 extending through the first and second surfaces 101, 102. The first surface 101 has electrical structures 14 formed thereon. The electrical structures 14 comprise at least two terminals 141. A light emitting element 20, for example, an LED chip, is provided and mounted on the first surface 101 of the base 10. A bottom surface of the light emitting element 20 is attached to the first surface 101. The light emitting element 20 has two pads 201 with reverse polarities at a top surface thereof. It is understood that the through holes 12 can be defined in the base 10 before or after that the light emitting element 20 is mounted on the base 10.

Referring to FIG. 3, a mask 30 is brought to cover the first surface 101 of the base 10. A space 501 is defined between the mask 30 and the first surface 101. The light emitting element 20 is received in the space 501. All of the through holes 12 of the base 10 are communicated with the space 501. The mask 30 is made of material with good light penetration and the light generated by the light emitting element 20 can penetrate through the mask 30 with little loss. Two openings 301 are defined in the mask 30 corresponding to the pads 201 of the light emitting element 20 respectively. The pads 201 are exposed to an outside of the mask 30 through the openings 301. The openings 301 are so dimensioned and configured that gaps between the mask 20 and the pads 201 are as small as possible, to thereby prevent liquid encapsulating material from leaking out of the mask 30 from the openings 301 when forming the encapsulating layer 50 as disclosed herebelow.

Figure 4:
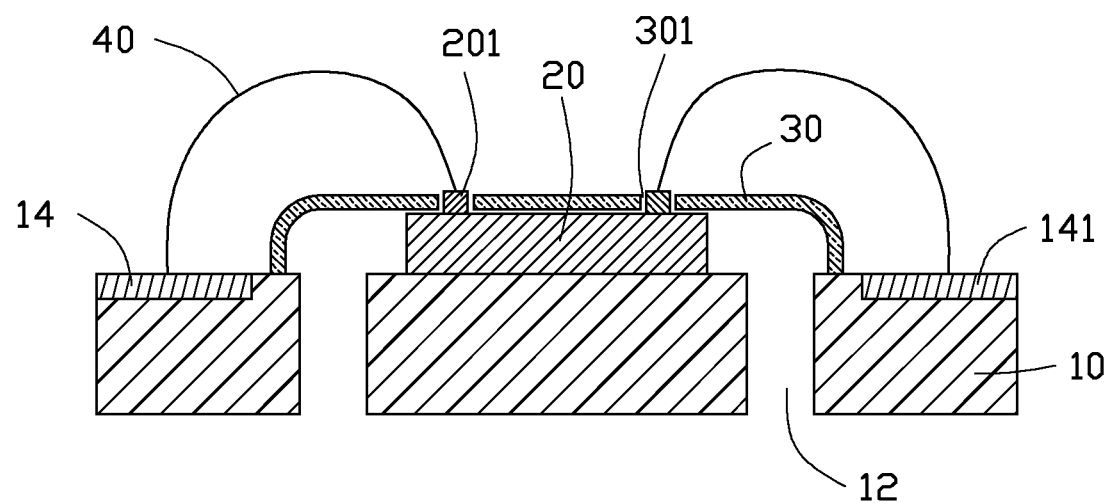

Referring to FIG. 4, it shows a step of electrically connecting the pads 201 of the light emitting element 20 and the terminals 141 of the electrical structures 14 with metal wires 40. The metal wires 40 are positioned outside of the mask 30. Each of the metal wires 40 has one end connected to one of the pads 201 and an opposite end connected to one of the terminals 141.

Figure 5:
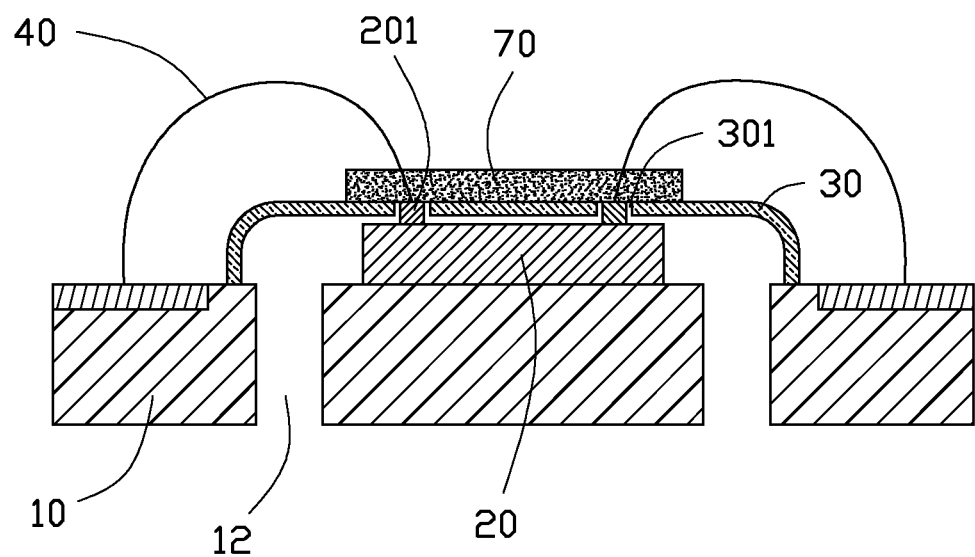

Referring to FIG. 5, a sealing layer 70 is positioned on the mask 30 and covers the joints of the pads 201 and the metal wires 40. The sealing layer 70 is made of material with good light penetration. The sealing layer 70 functions not only increasing a joining strength of the pads 201 and the metal wires 40, but also preventing liquid encapsulating material from leaking from the openings 301. The sealing layer 70 can also be designed to only cover at the openings 301 to reduce its coverage whereby shading of the light from the light emitting element 20 caused by the sealing 70 can be reduced, as shown in FIG. 6.

Figure 7:
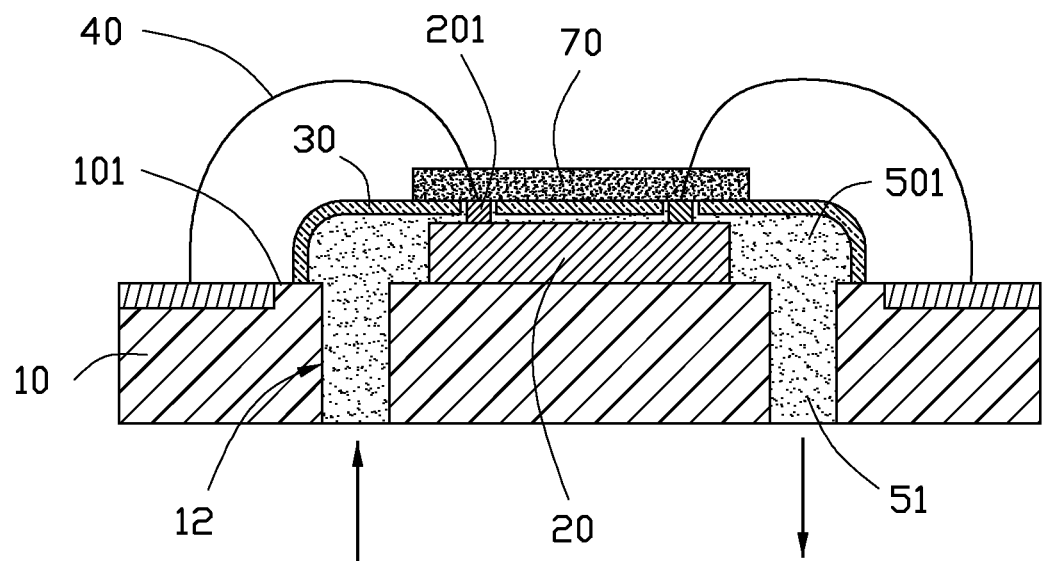
Figure 8:
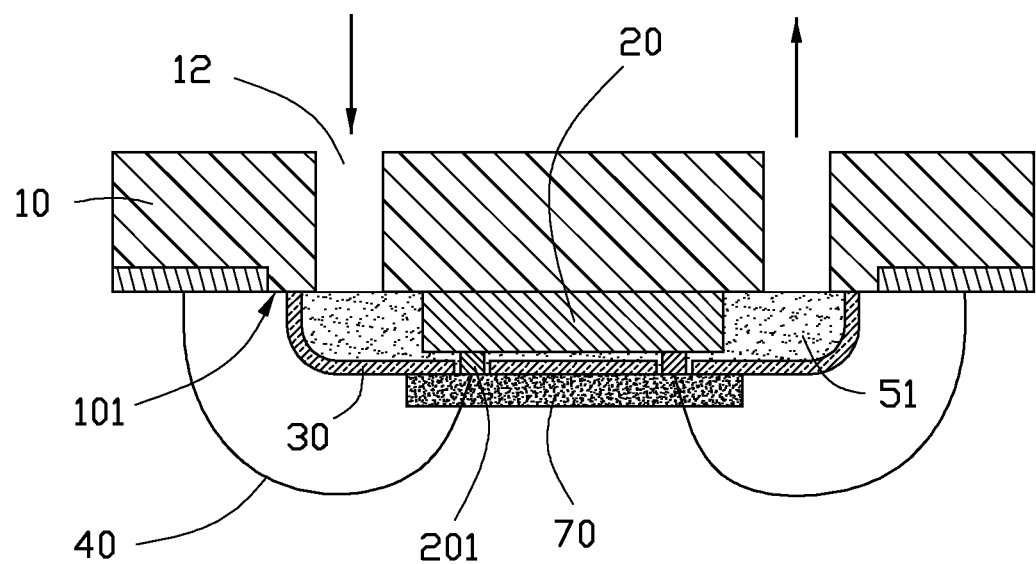

Referring to FIG. 7, liquid encapsulating material 51 is injected in the space 501 from one of the through holes 12 of the base 10, and air in the space 501 can be exhausted from another through hole 12 as shown by the arrows. The liquid encapsulating material 51 encapsulates the light emitting element 20 and forms the encapsulating layer 50 after solidification. Also referring to FIG. 8, the base 10 can be positioned upside down during the encapsulating. Thus, the amount of the liquid encapsulating material 51 can be well controlled to only fill in the space 501 with the through holes 12 unoccupied.

Referring to FIG. 9, in one embodiment, heat conductive material 15 can fill in the through holes 12 after forming the encapsulating layer 50. The heat conductive material 15 can be metal, ceramics, etc.

Referring FIG. 10 again, a cover layer 60 is provided on the first surface 101 of the base 10 and covers the mask 30 and the metal wires 40. The cover layer 60 protects the metal wires 40 and the mask 30 from damage. The cover layer 60 is made of transparent or translucent material, and comprises inorganic material such as SiO$_2$, TiO$_2$, etc. The cover layer 60 can be formed to have an inverted U-shaped configuration defining a space receiving the metal wires 40 and the mask 30 therein, whereby the cover layer 60 does not contact and is separated from the metal wires 40 and the mask 30.

Since the encapsulating layer 50 only encapsulates the light emitting element 20 and is separated from the metal wires 40, the joints of the light emitting element 20 and the metal wires 40 are prevented from being impacted by the encapsulating material 51 during the encapsulating process, whereby a reliability of the light emitting device package is increased.

Referring to FIG. 11 again, the electrical structures 14 can extend from the first surface 101 to the second surface 102 to form an extended layer 142, after forming the encapsulating layer 50. The extended layer 142 covers the through holes 12 to protect the encapsulating layer 50 from contamination. Also referring to FIG. 12 again, the extended layer 142 can be formed with the electrical structures 14 before the encapsulating process. For this, when subsequently defining the through holes 12 in the base 10, holes 143 are also defined in the extended layer 142. After forming the encapsulating layer 50, the holes 143 are sealed by soldering material 80.

Referring to FIG. 13 again, another sealing layer 90 can be formed on the second surface 102 of the base 10 to replace the extended layer 142. The another sealing layer 90 can be made of silicone, epoxy, or the mixture of the two.

Further, if the light emitting element 20 is a vertical structure LED, the mask 30 defines only one opening 301 corresponding to the pad 201 at the top surface of the light emitting element 20. The pad 201 at the bottom surface of the light emitting element 20 can be directly connected to one of the terminals 141 of the electrical structures 14. Other packaging steps for the vertical structure LED are similar to those of the previous embodiments; thus, a detailed description is omitted.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A light emitting device package comprising:
   a base having a first surface and an opposite second surface, the base forming electrical structures on the first surface and defining at least two through holes which extend through the first and second surfaces;
   a light emitting element with a bottom surface thereof attached to the first surface of the base, the light emitting element having at least one pad positioned on a top surface thereof;
   a mask arranged on the first surface of the base, the mask covering the light emitting element and defining at least one opening for exposing the at least one pad of the light emitting element;
   at least one metal wire positioned outside of the mask and electrically connecting the at least one pad and the electrical structures;
   an encapsulating layer filled between the first surface of the base and the mask, the encapsulating layer encapsulating the light emitting element, separated from the at least one metal wire and filling in the at least two through holes of the base, the encapsulating layer comprising phosphors therein; and
   a cover layer arranged on the first surface of the base for protecting the mask and the at least one metal wire.

2. The package of claim 1, wherein a sealing layer is formed on the mask for sealing the at least one opening and covering a joint of the at least one pad and the at least one metal wire.

3. The package of claim 2, wherein another sealing layer is formed on the second surface of the base for sealing the at least two through holes and protecting the encapsulating layer.

4. The package of claim 1, wherein the electrical structures further comprise an extended layer extending from the first surface to the second surface and covering the at least two through holes.

5. The package of claim 4, wherein the extended layer defines at least two holes corresponding to the at least two through holes of the base respectively, the at least two holes being filled with soldering material.

6. The package of claim 1, wherein the encapsulating filling in the at least two through holes of the base is replaced by heat conductive material.

7. The package of claim 1, wherein the light emitting element is a light emitting diode chip.

8. A light emitting device package comprising:
   a base having a first surface and an opposite second surface, the base forming electrical structures on the first surface and defining at least two through holes which extend through the first and second surfaces;
   a mask arranged on the first surface of the base, a space being defined between the mask and the first surface and communicated with the at least two through holes, and two openings being defined in the mask;
   a light emitting element mounted on the first surface and received in the space, the light emitting element having two pads with reverse polarities received in the two openings respectively;
   two metal wires positioned outside of the mask and electrically connecting the pads and the electrical structures;
   an encapsulating layer filled in the space and encapsulating the light emitting element, the encapsulating layer separated from the metal wires and filling in the at least two through holes of the base, the encapsulating layer comprising phosphors therein; and
   a cover layer covering and protecting the mask and the metal wires.

9. The package of claim 8, wherein a sealing layer is formed on the mask for sealing the openings and covering joints of the pads and the metal wires.

10. The package of claim 9, wherein another sealing layer is formed on the second surface of the base for sealing the at least two through holes and protecting the encapsulating layer.

11. The package of claim 8, wherein the electrical structures comprise two terminals each connecting one of the pads by one of the metal wires.

12. The package of claim 11, wherein the electrical structures further comprise extended layers extending from the terminals, the extended layers covering the second surface and sealing the at least two through holes.

13. The package of claim 12, wherein the extended layers each defines holes corresponding to the at least two through holes of the base respectively, the holes being filled with soldering material.

14. The package of claim 8, wherein the encapsulating layer filling in the at least two through holes of the base is replaced by heat conductive material.

15. The package of claim 8, wherein the light emitting element is a light emitting diode chip.

\* \* \* \* \*